(12) United States Patent
Katoch et al.

(10) Patent No.: US 12,665,004 B2
(45) Date of Patent: Jun. 23, 2026

(54) SENSING CIRCUIT OF MEMORY DEVICE AND CONTROL METHOD OF SENSING CIRCUIT

(71) Applicant: Taiwan Semiconductor Manufacturing Company, Ltd., Hsinchu (TW)

(72) Inventors: Atul Katoch, Ottawa (CA); Sergiy Romanovskyy, Ottawa (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 175 days.

(21) Appl. No.: 18/764,399

(22) Filed: Jul. 5, 2024

(65) Prior Publication Data

US 2026/0011353 A1 Jan. 8, 2026

(51) Int. Cl.
*G11C 7/10* (2006.01)
*G11C 7/08* (2006.01)
*G11C 7/12* (2006.01)

(52) U.S. Cl.
CPC .............. *G11C 7/1069* (2013.01); *G11C 7/08* (2013.01); *G11C 7/12* (2013.01)

(58) Field of Classification Search
CPC ............ G11C 7/1069; G11C 7/08; G11C 7/12
See application file for complete search history.

(56) References Cited

U.S. PATENT DOCUMENTS

2006/0092735 A1* 5/2006 Do ........................ G11C 7/1048
365/207

* cited by examiner

*Primary Examiner* — Han Yang
(74) *Attorney, Agent, or Firm* — JCIPRNET

(57) ABSTRACT

A sensing circuit and a control method of the sensing circuit are provided. The sensing circuit includes a data line, a complementary data line, a read bit line, a complementary read bit line, a read pass gate circuit and logic circuit. The logic circuit enables the read pass gate circuit when a voltage level on the read bit line and a voltage level on the complementary read bit line are pre-charged to a first voltage level, and disable the read pass gate circuit when one of the voltage level on the read bit line and the voltage level on the complementary read bit line is pull to a second voltage level different from the first voltage level. The read pass gate circuit is enabled to connect the data line to the read bit line and connect the complementary data line to the complementary read bit line.

20 Claims, 7 Drawing Sheets

230

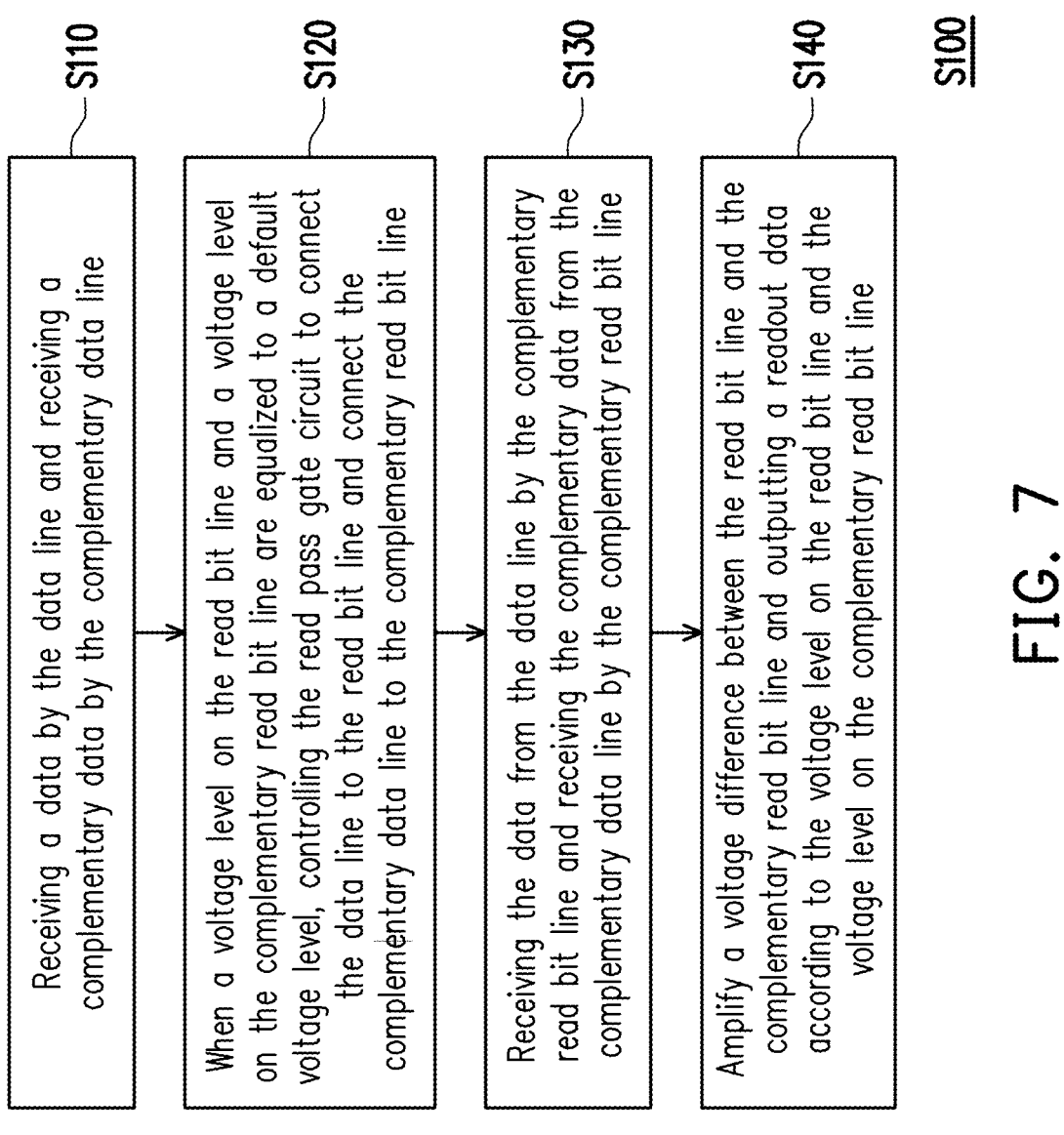

S110

Receiving a data by the data line and receiving a complementary data by the complementary data line

S120

When a voltage level on the read bit line and a voltage level on the complementary read bit line are equalized to a default voltage level, controlling the read pass gate circuit to connect the data line to the read bit line and connect the complementary data line to the complementary read bit line

S130

Receiving the data from the data line by the complementary read bit line and receiving the complementary data from the complementary data line by the complementary read bit line

S140

Amplify a voltage difference between the read bit line and the complementary read bit line and outputting a readout data according to the voltage level on the read bit line and the voltage level on the complementary read bit line

SENSING CIRCUIT OF MEMORY DEVICE AND CONTROL METHOD OF SENSING CIRCUIT

BACKGROUND

Generally, in a sensing circuit of a memory device includes a read pass gate circuit and a sense amplifier. In a read operation, after a sensing node of the sense amplifier is pre-charged, the read pass gate circuit is enabled according to a control signal provided by the memory device to pass a data to the sense amplifier. When the sense amplifier senses the data, the read pass gate circuit is disable to isolate the sensing circuit from the data according to the control signal from a control circuit. After the sense amplifier finishes sensing the data, the sensing node of the sense amplifier is pre-charged again and then the read pass gate circuit is enabled according to the control signal.

It should be noted, when controlling the read pass gate circuit, the memory device obtains a timing of sensing operation of the sense amplifier and a timing of the pre-charged operation to provide timing margin of the control signal. Thus, a rising edge and a falling edge of the control signal must be delayed. A time length of the read operation is increased.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 7 illustrates a flow diagram of a control method according to an of the disclosure.

DESCRIPTION OF THE EMBODIMENTS

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of a disclosure, the corresponding features, areas, steps, operations and/or components would be pointed to existence, but not limited to the existence of one or a plurality of the corresponding features, areas, steps, operations and/or components.

It will be understood that when an element is referred to as being "coupled to", "connected to", or "conducted to" another element, it may be directly connected to the other element and established directly electrical connection, or intervening elements may be presented therebetween for relaying electrical connection (indirectly electrical connection). In contrast, when an element is referred to as being "directly coupled to", "directly conducted to", or "directly connected to" another element, there are no intervening elements presented.

Figure 1:
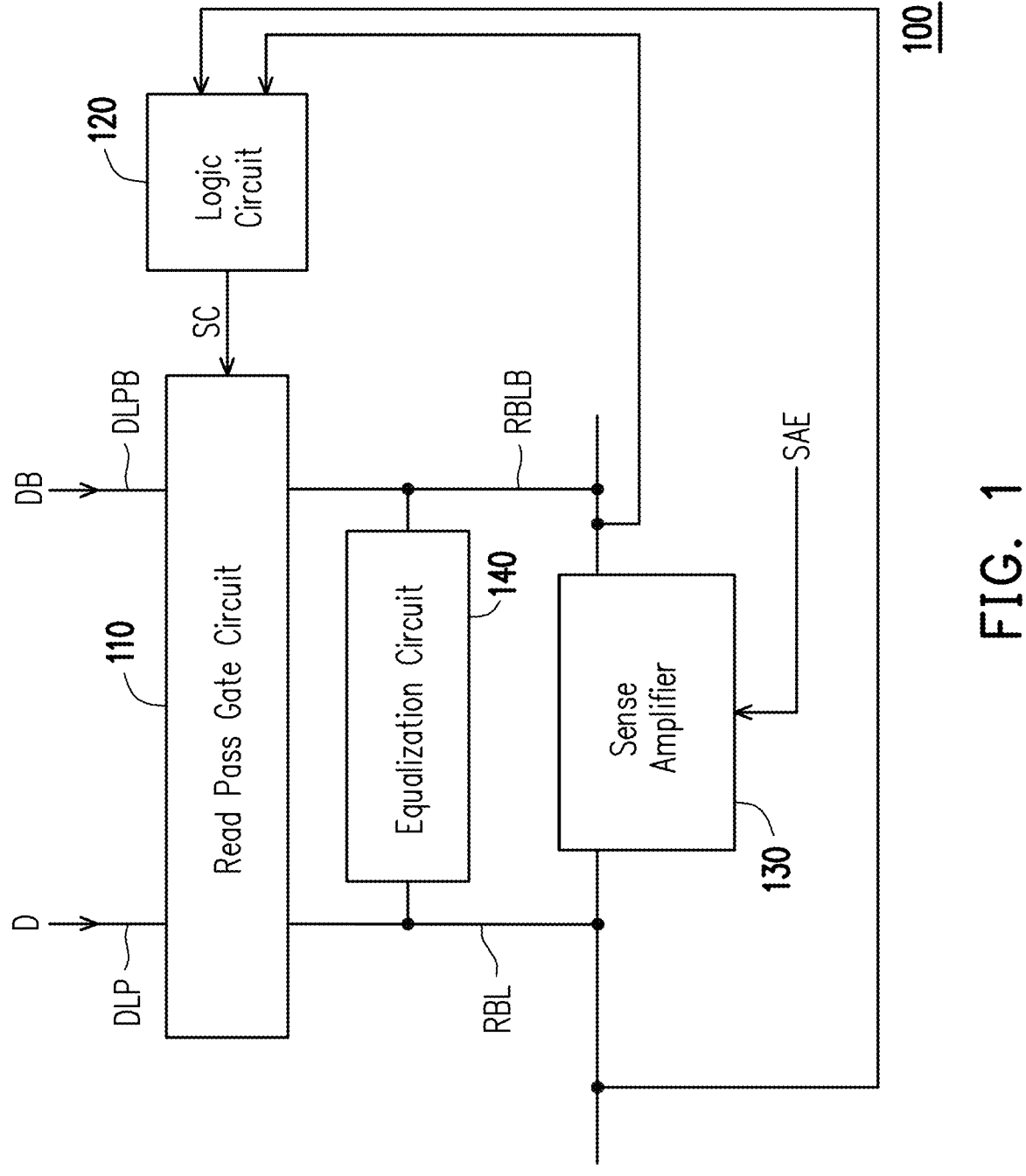
FIG. 1 illustrates a schematic diagram of a sensing circuit according to an embodiment of the disclosure.

Please refer to FIG. 1, FIG. 1 illustrates a schematic diagram of a sensing circuit according to an embodiment of the disclosure. In the embodiment, the sensing circuit 100 a memory device is used to sense data D from the memory device. For example, the memory device may be a SRAM device, but the disclosure is not limited thereto. In the embodiment, the sensing circuit 100 at least includes a data line DLP, a complementary data line DLPB, a read bit line RBL, a complementary read bit line RBLB, a read pass gate circuit 110 and a logic circuit 120. The data line DLP receive a data D. The complementary data line DLPB receives a complementary data DB. A logic level of complementary data DB and a logic level of data D are opposite to each other. The read pass gate circuit 110 is coupled to the data line DLP, the complementary data line DLPB, the read bit line RBL and the complementary read bit line RBLB.

In the embodiment, the logic circuit 120 is coupled to the read bit line RBL, the complementary read bit line RBLB and the read pass gate circuit 110. The logic circuit 120 receives a voltage level on the read bit line RBL and a voltage level on the complementary read bit line RBLB. When the voltage level on the read bit line RBL and the voltage level on the complementary read bit line RBLB are pre-charged to a first voltage level (that is, a default voltage level), the logic circuit 120 enables the read pass gate circuit 110. Therefore, the read pass gate circuit 110 is enabled to connect the data line DLP to the read bit line RBL and connect the complementary data line DLPB to the complementary read bit line RBLB. When one of the voltage level on the read bit line RBL and the voltage level on the complementary read bit line RBLB is pull to a second voltage level, the logic circuit 120 disables the read pass gate circuit 110. Therefore, the read pass gate circuit 110 is disabled to disconnect the data line DLP to the read bit line RBL and disconnect the complementary data line DLPB to the complementary read bit line RBLB. In other words, when one of the voltage level on the read bit line RBL and the voltage level on the complementary read bit line RBLB is pull to a second voltage level, the read pass gate circuit 110 isolates a connection between the data line DLP and the read bit line RBL, and isolates a connection between the complementary data line DLPB and the complementary read bit line RBLB.

When the voltage level on the read bit line RBL and the voltage level on the complementary read bit line RBLB are pre-charged (or equalized) to the first voltage level, it means that the sensing circuit 100 is in an initial period of a read operation. Therefore, the logic circuit 120 controls the read pass gate circuit 110 to connect the data line DLP to the read bit line RBL and connect the complementary data line DLPB to the complementary read bit line RBLB. The read bit line RBL receives the data D through the data line DLP. The complementary read bit line RBLB receives the complementary data DB through the complementary data line DLPB. Therefore, once the voltage level on the read bit line RBL and a voltage level on the complementary read bit line RBLB are pre-charged to the first voltage level, the sensing circuit 100 can start to sense the data D and the complementary data DB in an amplification period of the read operation.

Furthermore, the read bit line RBL receives the data D through the data line DLP. The complementary read bit line RBLB receives the complementary data DB through the complementary data line DLPB. One of the voltage level on the read bit line RBL and the voltage level on the complementary read bit line RBLB is pull to the second voltage level, it means that the sensing circuit 100 is in the amplification period of the read operation. The logic circuit 120 controls the read pass gate circuit 110 to disconnect the data line DLP to the read bit line RBL and disconnect the complementary data line DLPB to the complementary read bit line RBLB. Therefore, the sensing circuit 100 enters the initial period of the read operation.

It should be noted, the logic circuit 120 controls the read pass gate circuit 110 according to the voltage level on the read bit line RBL and the voltage level on the complementary read bit line RBLB. In other words, the read pass gate circuit 110 is controlled by actual voltage levels on the read bit line RBL and the complementary read bit line RBLB. The sensing circuit 100 provides a safe read operation without an external control signal. A timing margin of the amplification period can be shortened. In this way, a period of the read operation can be shortened.

In the embodiment, the sensing circuit 100 further includes a sense amplifier 130. The sense amplifier 130 is coupled to the read bit line RBL and the complementary read bit line RBLB. The sense amplifier 130 amplifies a voltage difference between the read bit line and the complementary read bit line in response to a voltage level of a sense enable signal SAE. In the embodiment, the sense amplifier 130 amplifies the voltage difference in the amplification period of the read operation.

In the embodiment, the sensing circuit 100 further includes an equalization circuit 140. The equalization circuit 140 is coupled to the read bit line RBL and the complementary read bit line RBLB. The equalization circuit 140 pulls (or pre-charges) the voltage level on the read bit line RBL and the voltage level on the complementary read bit line RBLB to the first voltage level in response to a voltage level of an equalization signal SAPREB. In the embodiment, the equalization circuit 140 pulls (or pre-charges) the voltage level on the read bit line RBL and the voltage level on the complementary read bit line RBLB to the first voltage level in the initial period of the read operation.

Figure 2:
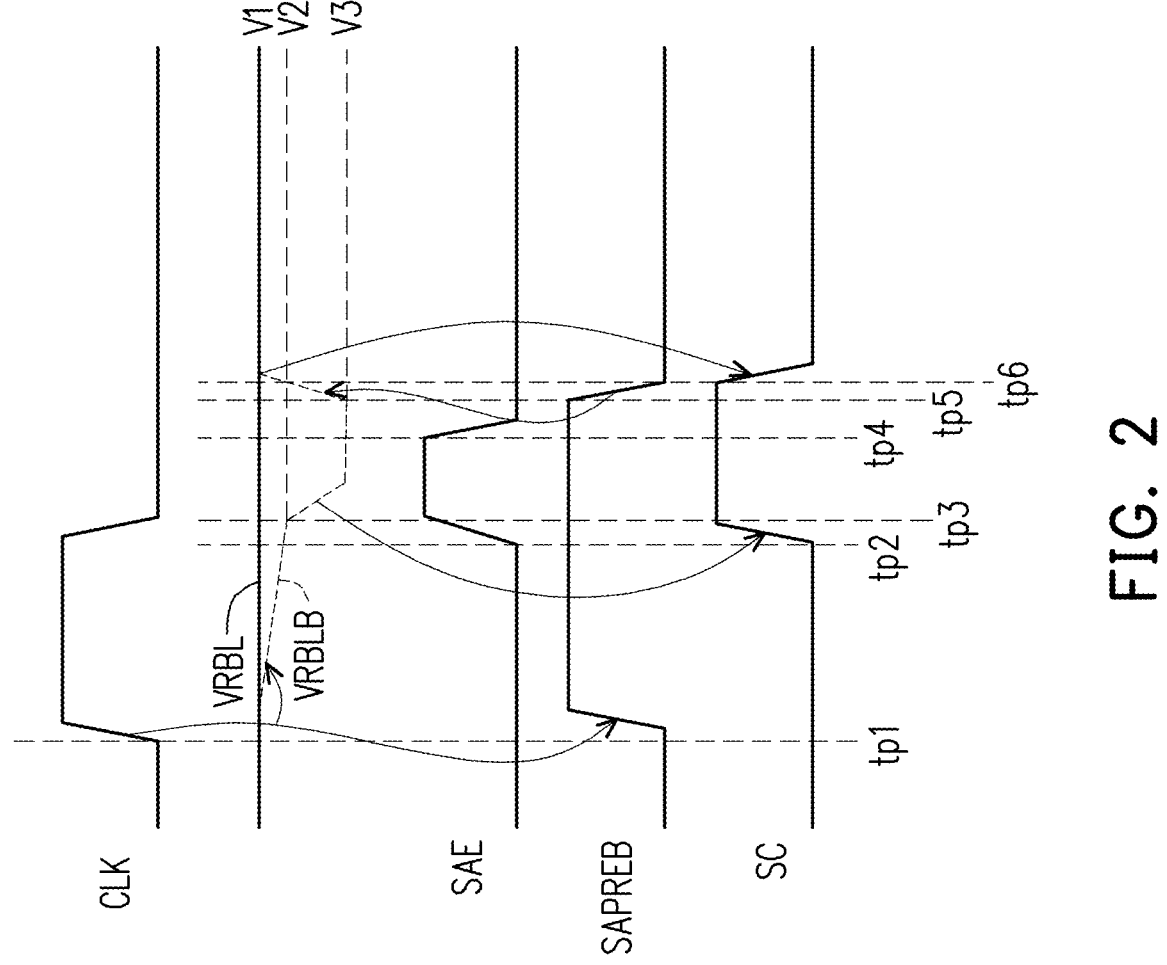
FIG. 2 illustrates a timing diagram of a sensing circuit according to an embodiment of the disclosure.

Please refer to FIG. 1 and FIG. 2, FIG. 2 illustrates a timing diagram of a sensing circuit according to an embodiment of the disclosure. In the embodiment, FIG. 2 illustrates timings the voltage VRBL on the read bit line RBL, the voltage VRBLB on the complementary read bit line RBLB, the equalization signal SAPREB, the sense enable signal SAE and a control signal SC provided by the logic circuit 120.

Before a time point tp1, in the initial period of the read operation, the voltage level of the equalization signal SAPREB is a low logic level, but the disclosure is not limited thereto. The equalization circuit 140 pulls (or pre-charges) the voltage VRBL on the read bit line RBL and the voltage VRBLB on the complementary read bit line RBLB using the first voltage value V1 in response to the low logic level of the equalization signal SAPREB. Therefore, before the time point tp1, the voltage VRBL and the voltage VRBLB are equalized to be the first voltage value V1.

Besides, the voltage VRBL and the voltage VRBLB are equalized to be the first voltage value V1. The voltage VRBL and the voltage VRBLB are the first voltage level. Therefore, the logic circuit 120 provides the control signal SC having the low logic level. The read pass gate circuit 110 is enabled by the control signal SC having the low logic level.

On the time point tp1, the voltage level of the equalization signal SAPREB is transited to a high logic level. For example, the voltage level of the equalization signal SAPREB is transited to the high logic level based on a rising edge of a clock CLK, but the disclosure is not limited thereto. The equalization circuit 140 is disabled in response to the high logic level of the equalization signal SAPREB. The voltage VRBLB on the complementary read bit line RBLB is pull down. In a time period between the time point tp1 and the time point tp2, the voltage VRBLB is still higher than a second voltage value V2. Therefore, the voltage VRBL and the voltage VRBLB are the first voltage level. Therefore, the read pass gate circuit 110 is still enabled.

On the time point tp2, the voltage VRBLB is pull to the second voltage value V2. Therefore, the voltage VRBLB is the second voltage level different from the first voltage level. The logic circuit 120 provides the control signal SC having the high logic level. The read pass gate circuit 110 is disabled by the control signal SC having the high logic level.

Between the time point tp3 and a time point tp4, the voltage level of the sense enable signal SAE is the high logic level. Therefore, the sense amplifier 130 is enabled to operate the amplification period between the time point tp3 and a time point tp4. In the amplification period, the voltage VRBLB is pull to a third voltage value V3.

In some embodiments, the time point tp3 is equal to the time point tp2.

On the time point tp5, the voltage level of the equalization signal SAPREB is transited to the low logic level. Therefore, the equalization circuit 140 is enabled to pull (or pre-charge) the voltage VRBL and the voltage VRBLB in response to the low logic level of the equalization signal SAPREB.

On the time point tp6, the voltage VRBLB is pull to higher than the second voltage value V2. Therefore, the logic circuit 120 provides the control signal SC having the low logic level. The read pass gate circuit 110 is enabled by the control signal SC having the low logic level. Therefore, the sensing circuit 100 enters the idle period.

It should be noted, the sensing circuit 100 can control the read pass gate circuit 110 automatically according to the voltage VRBL and the voltage VRBLB. Therefore, a margin between a rising edge of the sense enable signal SAE and a rising edge of the control signal SC can be decreased. A margin between a falling edge of the equalization signal SAPREB and a falling edge of the control signal SC can be decreased. In this way, a period of the read operation can be shortened.

Figure 3:
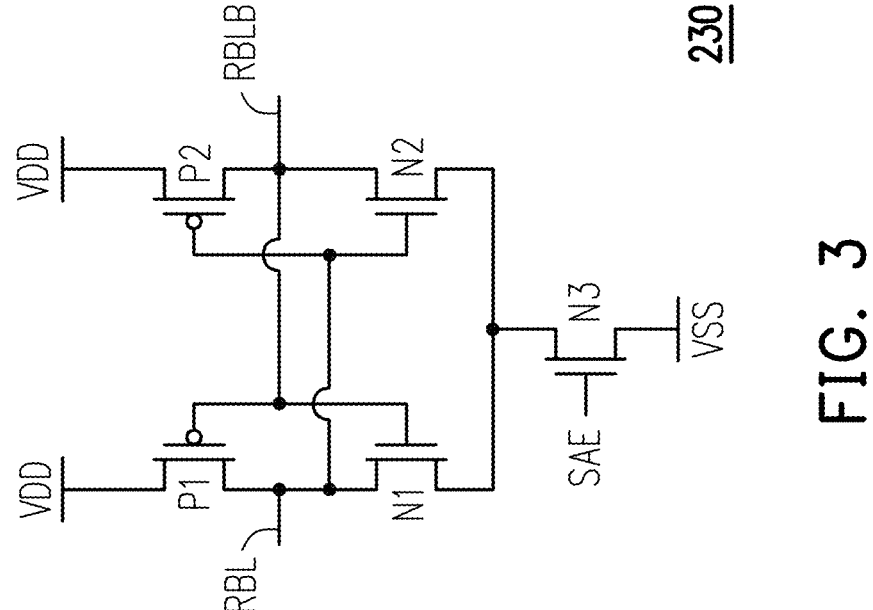
FIG. 3 illustrates a schematic diagram of a sense amplifier according to an embodiment of the disclosure.

Please refer to FIG. 1, FIG. 2 and FIG. 3, FIG. 3 illustrates a schematic diagram of a sense amplifier according to an embodiment of the disclosure. In the embodiment, the sense amplifier 230 includes P-type transistors P1 and P2, and N-type transistors N1, N2 and N3. A first terminal of the P-type transistor P1 is coupled to a reference high voltage VDD. A second terminal of the P-type transistor P1 is coupled to the read bit line RBL. A control terminal of the P-type transistor P1 is coupled to the complementary read bit line RBLB. A first terminal of the N-type transistor N1 is coupled to the second terminal of the P-type transistor P1. A control terminal of the N-type transistor N1 is coupled to the control terminal of the P-type transistor P1.

A first terminal of the P-type transistor P2 is coupled to the reference high voltage VDD. A second terminal of the P-type transistor P2 is coupled to the complementary read bit line RBLB. A control terminal of the P-type transistor P2 is coupled to the the read bit line RBL. A first terminal of the N-type transistor N2 is coupled to the second terminal of the P-type transistor P2. A control terminal of the N-type transistor N2 is coupled to the control terminal of the P-type transistor P2.

A first terminal of the N-type transistor N3 is coupled to a second terminal of the N-type transistor N1 and a second terminal of the N-type transistor N2. A second terminal of the N-type transistor N3 is coupled to a reference low voltage VSS. A control terminal of the N-type transistor N2 receives the sense enable signal SAE.

For example, the data D is logic "1". The complementary data DB is logic "0". Before the time point tp2, the sense amplifier 230 receives the data D and the complementary data DB. The voltage level of the sense enable signal SAE is the low logic level. The N-type transistor N3 is turned off. Therefore, the sense amplifier 230 is disabled before the time point tp2. Between the time point tp3 and the time point tp4, the voltage level of the sense enable signal SAE is the high logic level. The N-type transistor N3 is turned on. Therefore, the sense amplifier 230 pulls down the voltage VRBLB from the second voltage value V2 to the third voltage value V3 according to the voltage VRBL.

Figure 4:
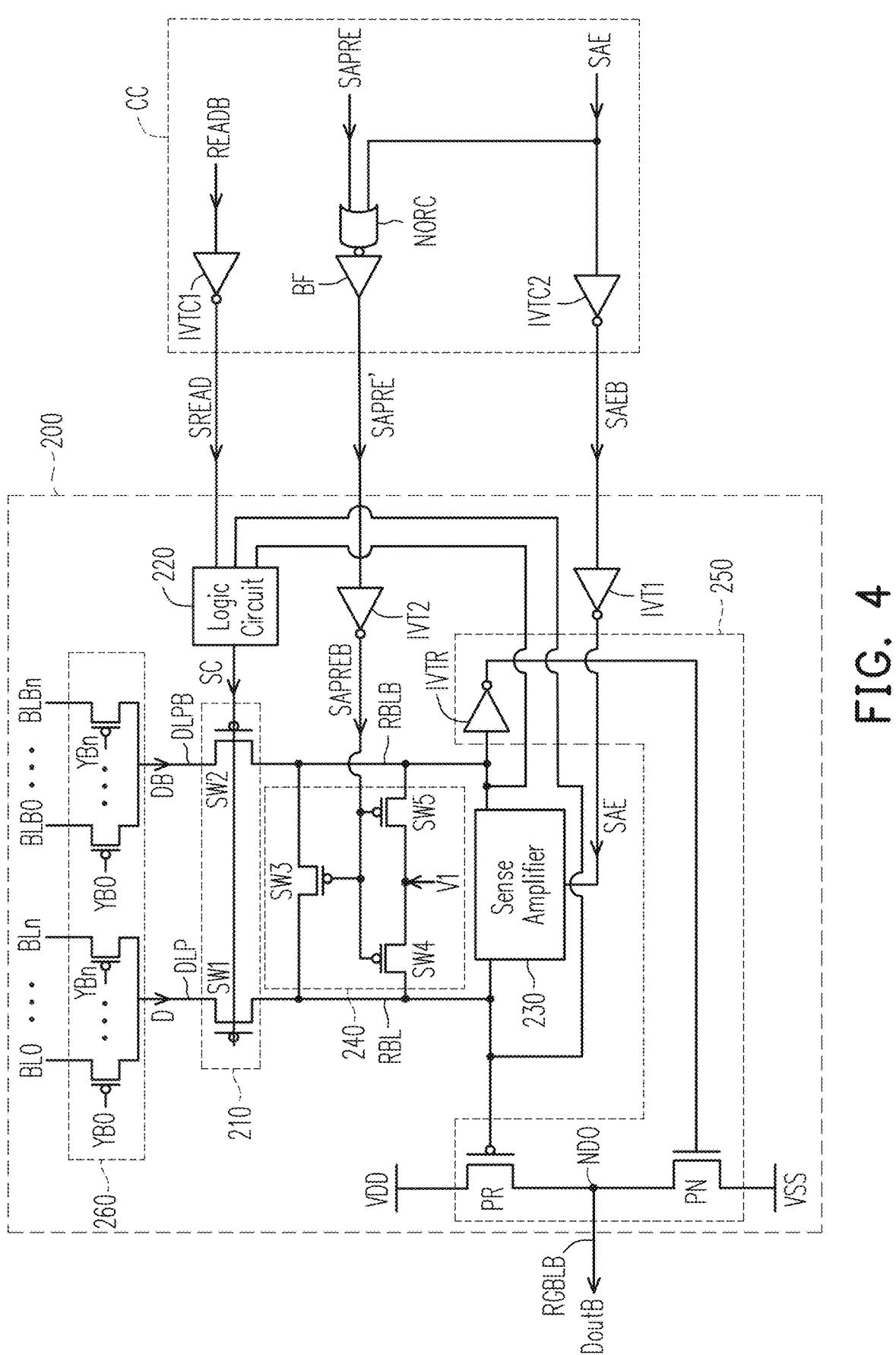
FIG. 4 illustrates a schematic diagram of a sensing circuit according to an embodiment of the disclosure.

Please refer to FIG. 4, FIG. 4 illustrates a schematic diagram of a sensing circuit according to an embodiment of the disclosure. In the embodiment, the sensing circuit 200 includes the data line DLP, the complementary data line DLPB, the read bit line RBL, the complementary read bit line RBLB, a read pass gate circuit 210, a logic circuit 220, the sense amplifier 230 and an equalization circuit 240. The sense amplifier 230 has been clearly explained in the embodiment of FIG. 3, so it will not be repeated here. The read pass gate circuit 210 includes switches SW1 and SW2. A first terminal of the switch SW1 is coupled to the data line DLP. A second terminal of the switch SW1 is coupled to the read bit line RBL. A control terminal of the switch SW1 is coupled to the logic circuit 210. A first terminal of the switch SW2 is coupled to the complementary data line DLPB. A second terminal of the switch SW2 is coupled to the complementary read bit line RBLB. A control terminal of the switch SW2 is coupled to the logic circuit 210.

In the embodiment, the equalization circuit 240 includes switches SW3 to SW5. A first terminal of the switch SW3 is coupled to the read bit line RBL. A second terminal of the switch SW3 is coupled to the complementary read bit line RBLB. A control terminal of the switch SW3 receives the equalization signal SAPREB. A first terminal of the switch SW4 is coupled to the read bit line RBL. A second terminal of the switch SW4 receives the first voltage value V1. A control terminal of the switch SW4 receives the equalization signal SAPREB. A first terminal of the switch SW5 receives the first voltage value V1. A second terminal of the switch SW5 is coupled to complementary read bit line RBLB. A control terminal of the switch SW5 receives the equalization signal SAPREB.

In the embodiment, each of the switches SW1 to SW5 may be implemented by a P-type transistor, but the disclosure is not limited thereto. Therefore, the read pass gate circuit 210 is enabled in response to the control signal SC having the low logic level and is disabled in response to the control signal SC having the high logic level. The equalization circuit 240 is enabled in response to the equalization signal SAPREB having the low logic level and is disabled in response to the equalization signal SAPREB having the high logic level.

In the embodiment, the logic circuit 220 controls the read pass gate circuit 210 according to a reading signal SREAD, the voltage level on the read bit line RBL and the voltage level on the complementary read bit line RBLB. In the embodiment, the reading signal SREAD is provided by a control circuit CC, but the disclosure is not limited thereto. For example, the control circuit CC generates a signal READB and inverts the signal READB to generate the reading signal SREAD by using an inverter IVTC1. In the read operation, a voltage level of the signal READB is the low logic level. Therefore, in the read operation, a voltage level of the reading signal SREAD is the high logic level. The logic circuit 220 is allowed to control the read pass gate circuit 210 according to the voltage level on the read bit line RBL and the voltage level on the complementary read bit line RBLB by the reading signal SREAD having the high logic level.

In the embodiment, the control circuit CC provides the sense enable signal SAE and a signal SAPRE, but the disclosure is not limited thereto. For example, the sense enable signal SAE is delayed by inverters IVTC2 and IVT1. For example, the inverter IVTC2 is in the control circuit CC, but the disclosure is not limited thereto. The inverter IVT1 is in the sensing circuit 200, but the disclosure is not limited thereto. In the read operation, the equalization signal SAPREB is generated by a logic operation on the signal SAPRE and the sense enable signal SAE. For example, the control circuit CC includes a NOR gate NORC and a buffer B1. A first input terminal of the NOR gate NORC receives the signal SAPRE. A second input terminal of the NOR gate NORC receives the sense enable signal SAE. An input terminal of the buffer B1 is coupled to an output terminal of the NOR gate NORC. An output terminal of the buffer B1 outputs a signal SAPRE'. An input terminal of an inverter IVT2 receives the outputs a signal SAPRE'. An output terminal of the inverter IVT2 outputs the equalization signal SAPREB. For example, the inverter IVT2 is in the sensing circuit 200, but the disclosure is not limited thereto.

In the embodiment, the sensing circuit 200 further includes a readout circuit 250. The readout circuit 250 is coupled to the read bit line RBL and the complementary read bit line RBLB. The readout circuit 250 outputs a readout data DoutB through an output node NDO according to the voltage level on the read bit line RBL and the voltage level on the complementary read bit line RBLB.

The readout circuit 250 includes an inverter IVTR, a P-type transistor PR and a N-type transistor PN. An input terminal of the inverter IVTR is coupled to the complementary read bit line RBLB. A first terminal of the P-type transistor PR is coupled to the reference high voltage VDD. A second terminal of the P-type transistor PR is coupled to the output node NDO. A control terminal of the P-type transistor PR is coupled to the read bit line RBL. A first terminal of the N-type transistor PN is coupled to the output node NDO. A second terminal of the N-type transistor PN is coupled to the reference low voltage VSS. A control terminal of the N-type transistor PN is coupled to an output terminal of the inverter IVTR. For example, the output node NDO is coupled to a global bit line RGBLB, but the disclosure is not limited thereto.

When the voltage level on the read bit line RBL is the high logic level and the voltage level on the complementary read bit line RBLB is the low logic level. The readout circuit 250 outputs the readout data DoutB having low logic level. When the voltage level on the read bit line RBL is the low logic level and the voltage level on the complementary read bit line RBLB is the high logic level. The readout circuit 250 outputs the readout data DoutB having high logic level.

In the embodiment, the sensing circuit 200 further includes a multiplexer 260. The multiplexer 260 selects one of bit lines BL0 to BLn as a selected bit line and selects a selected complementary bit line corresponding to the selected bit line according to selecting signals YB0 to YBn. For example, when the multiplexer 260 selects the bit line BL0 as the selected bit line, the multiplexer 260 selects the complementary bit line BLB0 as the selected complementary bit line. Then the multiplexer 260 transmits the data D on the bit line BL0 to the data line DLP and transmits the complementary data DB on the complementary bit line BLB0 to the complementary data line DLPB.

Figure 5:
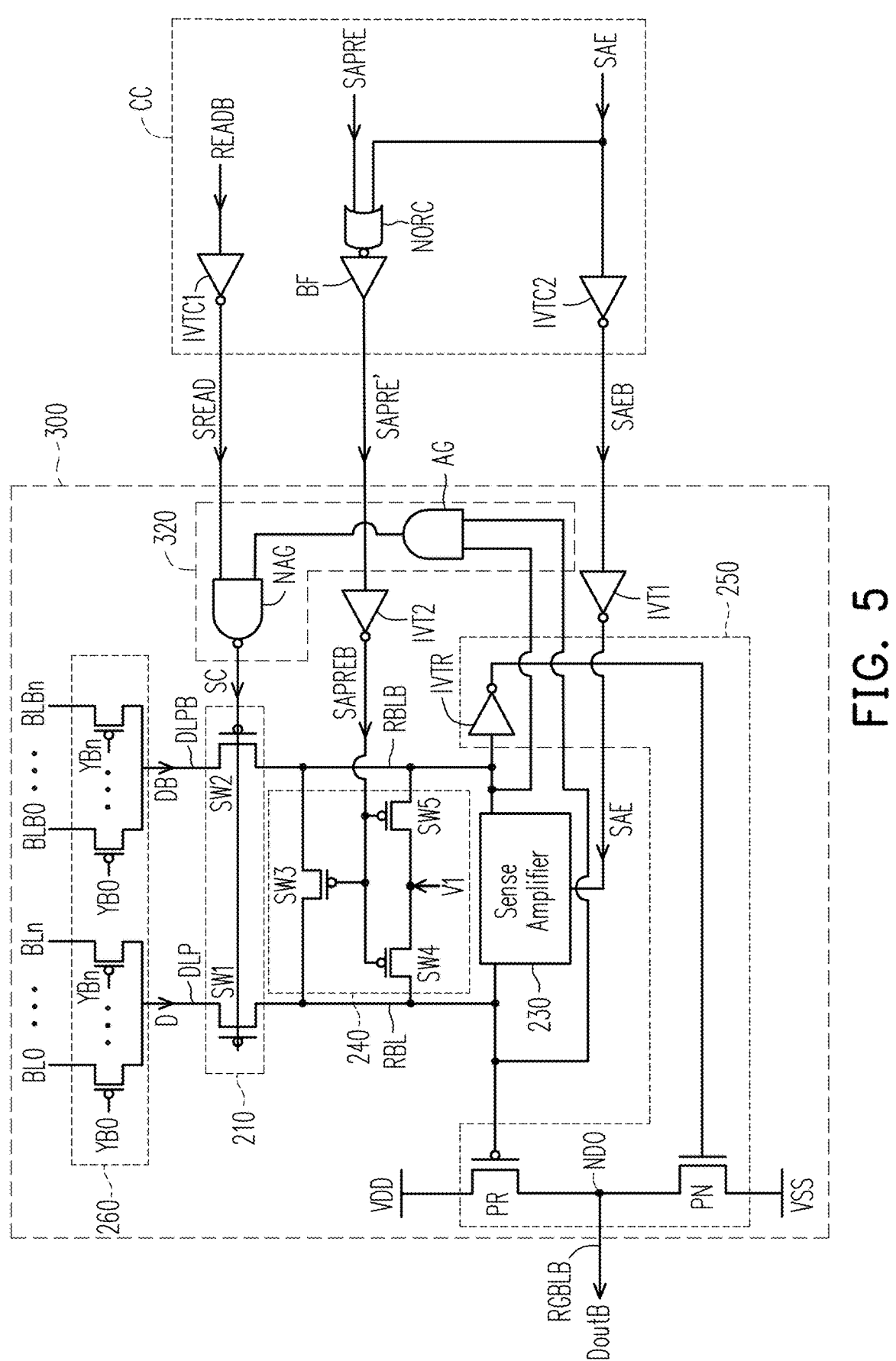
FIG. 5 illustrates a schematic diagram of a sensing circuit according to an embodiment of the disclosure.

Please refer to FIG. 5, FIG. 5 illustrates a schematic diagram of a sensing circuit according to an embodiment of the disclosure. In the embodiment, the sensing circuit 300 includes the data line DLP, the complementary data line DLPB, the read bit line RBL, the complementary read bit line RBLB, the read pass gate circuit 210, a logic circuit 320, the sense amplifier 230, the equalization circuit 240, the readout circuit 250 and the multiplexer 260. The read pass gate circuit 210, the equalization circuit 240, the readout circuit 250 and the multiplexer 260 have been clearly explained in the embodiment of FIG. 4, so it will not be repeated here. The sense amplifier 230 has been clearly explained in the embodiment of FIG. 3, so it will not be repeated here.

In the embodiment, the logic circuit 320 includes a AND gate AG and a NAND gate NAG. A first input terminal of the AND gate AG is coupled to the read bit line RBL. A second input terminal of the AND gate AG is coupled to the complementary read bit line RBLB. A first input terminal of the NAND gate NAG is coupled to an output terminal of the AND gate AG. A second input terminal of the NAND gate NAG receives the reading signal SREAD. An output terminal of the NAND gate NAG is coupled to the read pass gate circuit 210.

When the reading signal SREAD has the high logic level, if the voltage level on the read bit line RBL and the voltage level on the complementary read bit line RBLB are pre-charged to a first voltage level V1, the AND gate AG outputs a signal having the high logic level. Therefore, the logic circuit 320 outputs control signal SC having the low logic level to enable the read pass gate circuit 210.

When the reading signal SREAD has the high logic level, if the voltage level on the read bit line RBL is different from the voltage level on the complementary read bit line RBLB, the AND gate AG outputs a signal having the low logic level. Therefore, the logic circuit 320 outputs control signal SC having the high logic level to disable the read pass gate circuit 210.

When the reading signal SREAD has the low logic level, the logic circuit 320 outputs control signal SC having the high logic level to disable the read pass gate circuit 210.

Figure 6:
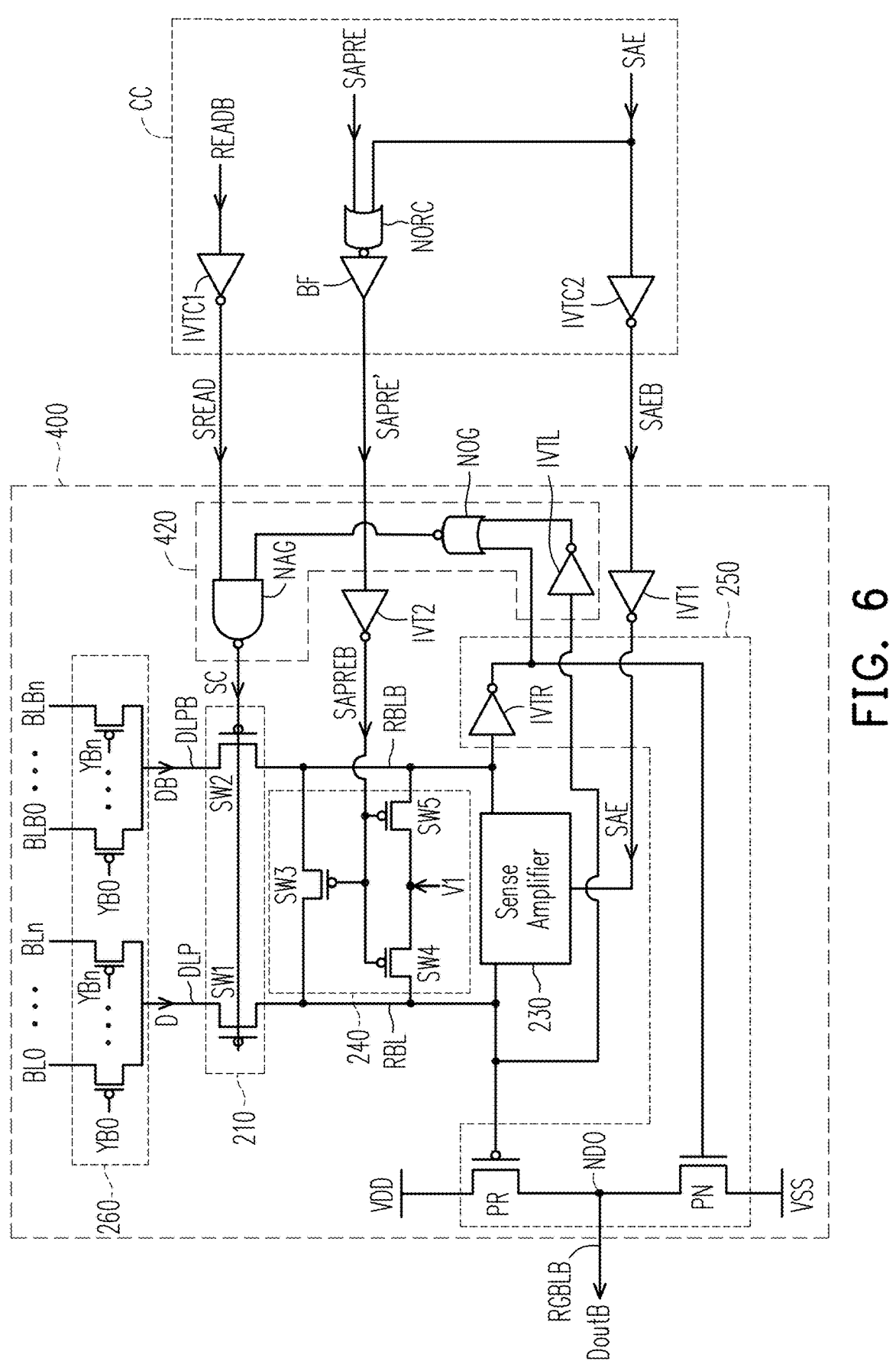
FIG. 6 illustrates a schematic diagram of a sensing circuit according to an embodiment of the disclosure.

Please refer to FIG. 6, FIG. 6 illustrates a schematic diagram of a sensing circuit according to an embodiment of the disclosure. In the embodiment, the sensing circuit 400 includes the data line DLP, the complementary data line DLPB, the read bit line RBL, the complementary read bit line RBLB, the read pass gate circuit 210, a logic circuit 420, the sense amplifier 230, the equalization circuit 240, the readout circuit 250 and the multiplexer 260. The read pass gate circuit 210, the equalization circuit 240, the readout circuit 250 and the multiplexer 260 have been clearly explained in the embodiment of FIG. 4, so it will not be repeated here. The sense amplifier 230 has been clearly explained in the embodiment of FIG. 3, so it will not be repeated here.

In the embodiment, the logic circuit 420 includes an inverter IVTL, a NOR gate NOG and a NAND gate NAG. An input terminal of the inverter IVTL is coupled to the read bit line RBL. A first input terminal of the NOR gate NOG is coupled to an output terminal of the inverter IVTL. A second input terminal of the NOR gate NOG is coupled to an output terminal of the inverter IVTR. A first input terminal of the NAND gate NAG is coupled to an output terminal of the NOR gate NOG. A second input terminal of the NAND gate NAG receives the reading signal SREAD. An output terminal of the NAND gate NAG is coupled to the read pass gate circuit 210.

When the reading signal SREAD has the high logic level, if the voltage level on the read bit line RBL and the voltage level on the complementary read bit line RBLB are pre-charged to a first voltage level V1, the NOR gate NOG outputs a signal having the high logic level. Therefore, the logic circuit 420 outputs control signal SC having the low logic level to enable the read pass gate circuit 210.

When the reading signal SREAD has the high logic level, if the voltage level on the read bit line RBL is different from the voltage level on the complementary read bit line RBLB, the NOR gate NOG outputs a signal having the low logic level. Therefore, the logic circuit 420 outputs control signal SC having the high logic level to disable the read pass gate circuit 210.

When the reading signal SREAD has the low logic level, the logic circuit 320 outputs control signal SC having the high logic level to disable the read pass gate circuit 210.

Please refer to FIG. 1 and FIG. 7, FIG. 7 illustrates a flow diagram of a control method according to an of the disclosure. In the embodiment, the control method S100 at least includes steps S110 to S140. In the step S110, the data line DLP receive a data D. The complementary data line DLPB receives a complementary data DB.

In the step S120, when the voltage level on the read bit line RBL and the voltage level on the complementary read bit line RBLB are pre-charged to a first voltage level (that is, a default voltage level), the read pass gate circuit 110 is controlled to connect the data line DLP to the read bit line RBL and connect the complementary data line DLPB to the complementary read bit line RBLB.

In the step S130, the sense amplifier 130 receives the data D from the data line DLP by the complementary read bit line RBL, and receives the complementary data DB from the complementary data line DLPB by the complementary read bit line RBLB.

In the step S140, the sense amplifier 130 amplifies the voltage difference between the read bit line and the complementary read bit line in response to a voltage level of a sense enable signal SAE. The sense amplifier 130 outputs a readout data (that is, the readout data DoutB in FIG. 4 to FIG. 6) according to the voltage level on the read bit line RBL and the voltage level on the complementary read bit line RBLB.

Besides, in the embodiment, when the voltage level on the read bit line RBL is different from the voltage level on the complementary read bit line RBLB, the read pass gate circuit 110 is controlled to disconnect the data line DLP to the read bit line RBL and disconnect the complementary data line DLP to the complementary read bit line RBL.

The steps S110 to S140 have been clearly explained in the embodiments of FIG. 1, so it will not be repeated here.

In an embodiment of the disclosure, a sensing circuit includes a data line, a complementary data line, a read bit line, a complementary read bit line, a read pass gate circuit and logic circuit. The data line receives a data. The complementary data line receives a complementary data. The read pass gate circuit is coupled to the data line, the complementary data line, the read bit line and the complementary read bit line. The logic circuit is coupled to the read bit line, the complementary read bit line and the read pass gate circuit. The logic circuit enables the read pass gate circuit when a voltage level on the read bit line and a voltage level on the complementary read bit line are equalized to a first voltage level, and disable the read pass gate circuit when one of the voltage level on the read bit line and the voltage level on the complementary read bit line is pull to a second voltage level different from the first voltage level. The read pass gate circuit is enabled to connect the data line to the read bit line and connect the complementary data line to the complementary read bit line.

In some embodiments, the read pass gate circuit is disabled to disconnect the data line to the read bit line and disconnect the complementary data line to the complementary read bit line.

In some embodiments, the sensing circuit further includes an equalization circuit. The equalization circuit is coupled to the read bit line and the complementary read bit line. The equalization circuit pulls the voltage level on the read bit line and the voltage level on the complementary read bit line to the first voltage level in response to a voltage level of an equalization signal.

In some embodiments, the sensing circuit further includes a sense amplifier. The sense amplifier is coupled to the read bit line and the complementary read bit line. The sense amplifier amplifies a voltage difference between the read bit line and the complementary read bit line in response to a voltage level of a sense enable signal.

In some embodiments, the read pass gate circuit includes a first switch and a second switch. A first terminal of the first switch is coupled to the data line. A second terminal of the first switch is coupled to the read bit line. A control terminal of the first switch is coupled to the logic circuit. A first terminal of the second switch is coupled to the complementary data line. A second terminal of the second switch is coupled to the complementary read bit line. A control terminal of the second switch is coupled to the logic circuit.

In some embodiments, the logic circuit controls the read pass gate circuit according to a reading signal, the voltage level on the read bit line and the voltage level on the complementary read bit line.

In some embodiments, the logic circuit includes a AND gate and a NAND gate. A first input terminal of the AND gate is coupled to the read bit line. A second input terminal of the AND gate is coupled to the complementary read bit line. A first input terminal of the NAND gate is coupled to an output terminal of the AND gate. A second input terminal of the NAND gate receives the reading signal. An output terminal of the NAND gate is coupled to the read pass gate circuit.

In some embodiments, the sensing circuit further includes a readout circuit. The readout circuit is coupled to the read bit line and the complementary read bit line. The readout circuit outputs a readout data according to the voltage level on the read bit line and the voltage level on the complementary read bit line.

In some embodiments, the readout circuit includes a first inverter, a P-type transistor and a N-type transistor. An input terminal of the first inverter is coupled to the complementary read bit line. A first terminal of the P-type transistor is coupled to a reference high voltage. A second terminal of the P-type transistor is coupled to an output node. A control terminal of the P-type transistor is coupled to the read bit line. A first terminal of the N-type transistor is coupled to the output node. A second terminal of the N-type transistor is coupled to a reference low voltage. A control terminal of the N-type transistor is coupled to an output terminal of the first inverter.

In some embodiments, the logic circuit includes a second inverter, a NOR gate and a NAND gate. An input terminal of the second inverter is coupled to the read bit line. A first input terminal of the NOR gate is coupled to an output terminal of the second inverter. A second input terminal of the NOR gate is coupled to an output terminal of the first inverter. A first input terminal of the NAND gate is coupled to an output terminal of the NOR gate. A second input terminal of the NAND gate receives the reading signal. An output terminal of the NAND gate is coupled to the read pass gate circuit.

In an embodiment of the disclosure, a sensing circuit includes a data line, a complementary data line, a read bit line, a complementary read bit line, a read pass gate circuit, a sense amplifier and logic circuit. The data line receives a data. The complementary data line receives a complementary data. The logic circuit is coupled to the read bit line, the complementary read bit line and the read pass gate circuit. The logic circuit controls the read pass gate circuit to connect the data line to the read bit line and connect the complementary data line to the complementary read bit line when a voltage level on the read bit line and a voltage level on the complementary read bit line are a default voltage level. The sense amplifier is coupled to the read bit line and the complementary read bit line. The logic circuit controls the read pass gate circuit to disconnect the data line to the read bit line and disconnect the complementary data line to the complementary read bit line when the voltage level on the read bit line is different from the voltage level on the complementary read bit line. The sense amplifier amplifies a voltage difference between the read bit line and the complementary read bit line when the voltage level on the read bit line is different from the voltage level on the complementary read bit line.

In some embodiments, the sensing circuit further includes an equalization circuit. The equalization circuit is coupled to the read bit line and the complementary read bit line. The equalization circuit pulls the voltage level on the read bit line and the voltage level on the complementary read bit line to the default voltage level in response to a voltage level of an equalization signal.

In some embodiments, the read pass gate circuit includes a first switch and a second switch. A first terminal of the first switch is coupled to the data line. A second terminal of the first switch is coupled to the read bit line. A control terminal of the first switch is coupled to the logic circuit. A first terminal of the second switch is coupled to the complementary data line. A second terminal of the second switch is coupled to the complementary read bit line. A control terminal of the second switch is coupled to the logic circuit.

In some embodiments, the logic circuit controls the read pass gate circuit according to a reading signal, the voltage level on the read bit line and the voltage level on the complementary read bit line.

In some embodiments, the logic circuit includes a AND gate and a NAND gate. A first input terminal of the AND gate is coupled to the read bit line. A second input terminal of the AND gate is coupled to the complementary read bit line. A first input terminal of the NAND gate is coupled to an output terminal of the AND gate. A second input terminal of the NAND gate receives the reading signal. An output terminal of the NAND gate is coupled to the read pass gate circuit.

In some embodiments, the sensing circuit further includes a readout circuit. The readout circuit is coupled to the read bit line and the complementary read bit line. The readout circuit outputs a readout data according to the voltage level on the read bit line and the voltage level on the complementary read bit line.

In some embodiments, the readout circuit includes a first inverter, a P-type transistor and a N-type transistor. An input terminal of the first inverter is coupled to the complementary read bit line. A first terminal of the P-type transistor is coupled to a reference high voltage. A second terminal of the P-type transistor is coupled to an output node. A control terminal of the P-type transistor is coupled to the read bit line. A first terminal of the N-type transistor is coupled to the output node. A second terminal of the N-type transistor is coupled to a reference low voltage. A control terminal of the N-type transistor is coupled to an output terminal of the first inverter.

In some embodiments, the logic circuit includes a second inverter, a NOR gate and a NAND gate. An input terminal of the second inverter is coupled to the read bit line. A first input terminal of the NOR gate is coupled to an output terminal of the second inverter. A second input terminal of the NOR gate is coupled to an output terminal of the first inverter. A first input terminal of the NAND gate is coupled to an output terminal of the NOR gate. A second input terminal of the NAND gate receives the reading signal. An output terminal of the NAND gate is coupled to the read pass gate circuit.

In an embodiment of the disclosure, a control method is used for a sensing circuit. The sensing circuit comprises a data line, a complementary data line, a read bit line, a complementary read bit line and a read pass gate circuit. The control method includes: receiving a data by the data line and receiving a complementary data by the complementary data line; when a voltage level on the read bit line and a voltage level on the complementary read bit line are equalized to a default voltage level, controlling the read pass gate circuit to connect the data line to the read bit line and connect the complementary data line to the complementary read bit line; receiving the data from the data line by the complementary read bit line and receiving the complementary data from the complementary data line by the complementary read bit line; and amplifying a voltage difference between the read bit line and the complementary read bit line and outputting a readout data according to the voltage level on the read bit line and the voltage level on the complementary read bit line.

In some embodiments, the control method further comprising: when the voltage level on the read bit line is different from the voltage level on the complementary read bit line, controlling the read pass gate circuit to disconnect the data line to the read bit line and disconnect the complementary data line to the complementary read bit line.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A sensing circuit of a memory device, comprising:
   a data line, configured to receive a data;
   a complementary data line, configured to receive a complementary data;
   a read bit line;
   a complementary read bit line;
   a read pass gate circuit, coupled to the data line, the complementary data line, the read bit line and the complementary read bit line;
   a logic circuit, coupled to the read bit line, the complementary read bit line and the read pass gate circuit, and configured to enable the read pass gate circuit when a voltage level on the read bit line and a voltage level on the complementary read bit line are pre-charged to a first voltage level, and disable the read pass gate circuit when one of the voltage level on the read bit line and the voltage level on the complementary read bit line is pull to a second voltage level different from the first voltage level,
   wherein the read pass gate circuit is enabled to connect the data line to the read bit line and connect the complementary data line to the complementary read bit line.

2. The sensing circuit of claim 1, wherein the read pass gate circuit is disabled to disconnect the data line to the read bit line and disconnect the complementary data line to the complementary read bit line.

3. The sensing circuit of claim 1, further comprising:
   an equalization circuit, coupled to the read bit line and the complementary read bit line, and configured to pull the voltage level on the read bit line and the voltage level on the complementary read bit line to the first voltage level in response to a voltage level of an equalization signal.

4. The sensing circuit of claim 1, further comprising:
   a sense amplifier, coupled to the read bit line and the complementary read bit line, and configured to amplify a voltage difference between the read bit line and the complementary read bit line in response to a voltage level of a sense enable signal.

5. The sensing circuit of claim 1, wherein the read pass gate circuit comprises:
   a first switch, a first terminal of the first switch is coupled to the data line, a second terminal of the first switch is coupled to the read bit line, a control terminal of the first switch is coupled to the logic circuit; and
   a second switch, a first terminal of the second switch is coupled to the complementary data line, a second terminal of the second switch is coupled to the complementary read bit line, a control terminal of the second switch is coupled to the logic circuit.

6. The sensing circuit of claim 1, wherein the logic circuit controls the read pass gate circuit according to a reading signal, the voltage level on the read bit line and the voltage level on the complementary read bit line.

7. The sensing circuit of claim 6, wherein the logic circuit comprises:

a AND gate, a first input terminal of the AND gate is coupled to the read bit line, a second input terminal of the AND gate is coupled to the complementary read bit line; and a NAND gate, a first input terminal of the NAND gate is coupled to an output terminal of the AND gate, a second input terminal of the NAND gate receives the reading signal, an output terminal of the NAND gate is coupled to the read pass gate circuit.

8. The sensing circuit of claim 6, further comprising:

a readout circuit, coupled to the read bit line and the complementary read bit line, and configured to output a readout data according to the voltage level on the read bit line and the voltage level on the complementary read bit line.

9. The sensing circuit of claim 8, wherein the readout circuit comprises:

a first inverter, an input terminal of the first inverter is coupled to the complementary read bit line;

a P-type transistor, a first terminal of the P-type transistor is coupled to a reference high voltage, a second terminal of the P-type transistor is coupled to an output node, a control terminal of the P-type transistor is coupled to the read bit line; and a N-type transistor, a first terminal of the N-type transistor is coupled to the output node, a second terminal of the N-type transistor is coupled to a reference low voltage, a control terminal of the N-type transistor is coupled to an output terminal of the first inverter.

10. The sensing circuit of claim 9, wherein the logic circuit comprises:

a second inverter, an input terminal of the second inverter is coupled to the read bit line;

a NOR gate, a first input terminal of the NOR gate is coupled to an output terminal of the second inverter, a second input terminal of the NOR gate is coupled to an output terminal of the first inverter; and a NAND gate, a first input terminal of the NAND gate is coupled to an output terminal of the NOR gate, a second input terminal of the NAND gate receives the reading signal, an output terminal of the NAND gate is coupled to the read pass gate circuit.

11. A sensing circuit, comprising:

a data line, configured to receive a data;

a complementary data line, configured to receive a complementary data;

a read bit line;

a complementary read bit line;

a read pass gate circuit;

a logic circuit, coupled to the read bit line, the complementary read bit line and the read pass gate circuit, and configured to control the read pass gate circuit to connect the data line to the read bit line and connect the complementary data line to the complementary read bit line when a voltage level on the read bit line and a voltage level on the complementary read bit line are pre-charged to a default voltage level, and control the read pass gate circuit to disconnect the data line to the read bit line and disconnect the complementary data line to the complementary read bit line when the voltage level on the read bit line is different from the voltage level on the complementary read bit line; and a sense amplifier, coupled to the read bit line and the complementary read bit line, and configured to amplifies a voltage difference between the read bit line and the complementary read bit line when the voltage level on the read bit line is different from the voltage level on the complementary read bit line.

12. The sensing circuit of claim 11, further comprising:

an equalization circuit, coupled to the read bit line and the complementary read bit line, and configured to pull the voltage level on the read bit line and the voltage level on the complementary read bit line to the default voltage level in response to a voltage level of an equalization signal.

13. The sensing circuit of claim 11, wherein the read pass gate circuit comprises:

a first switch, a first terminal of the first switch is coupled to the data line, a second terminal of the first switch is coupled to the read bit line, a control terminal of the first switch is coupled to the logic circuit; and a second switch, a first terminal of the second switch is coupled to the complementary data line, a second terminal of the second switch is coupled to the complementary read bit line, a control terminal of the second switch is coupled to the logic circuit.

14. The sensing circuit of claim 11, wherein the logic circuit controls the read pass gate circuit according to a reading signal, the voltage level on the read bit line and the voltage level on the complementary read bit line.

15. The sensing circuit of claim 14, wherein the logic circuit comprises:

a AND gate, a first input terminal of the AND gate is coupled to the read bit line, a second input terminal of the AND gate is coupled to the complementary read bit line; and a NAND gate, a first input terminal of the NAND gate is coupled to an output terminal of the AND gate, a second input terminal of the NAND gate receives the reading signal, an output terminal of the NAND gate is coupled to the read pass gate circuit.

16. The sensing circuit of claim 14, further comprising:

a readout circuit, coupled to the read bit line and the complementary read bit line, and configured to output a readout data according to the voltage level on the read bit line and the voltage level on the complementary read bit line.

17. The sensing circuit of claim 16, wherein the readout circuit comprises:

a first inverter, an input terminal of the first inverter is coupled to the complementary read bit line;

a P-type transistor, a first terminal of the P-type transistor is coupled to a reference high voltage, a second terminal of the P-type transistor is coupled to an output node, a control terminal of the P-type transistor is coupled to the read bit line; and a N-type transistor, a first terminal of the N-type transistor is coupled to the output node, a second terminal of the N-type transistor is coupled to a reference low voltage, a control terminal of the N-type transistor is coupled to an output terminal of the first inverter.

18. The sensing circuit of claim 17, wherein the logic circuit comprises:

a second inverter, an input terminal of the second inverter is coupled to the read bit line;

a NOR gate, a first input terminal of the NOR gate is coupled to an output terminal of the second inverter, a second input terminal of the NOR gate is coupled to an output terminal of the first inverter; and a NAND gate, a first input terminal of the NAND gate is coupled to an output terminal of the NOR gate, a second input terminal of the NAND gate receives the reading signal, an output terminal of the NAND gate is coupled to the read pass gate circuit.

19. A control method of a sensing circuit, wherein the sensing circuit comprises a data line, a complementary data line, a read bit line, a complementary read bit line and a read pass gate circuit, wherein the control method comprises:

receiving a data by the data line and receiving a complementary data by the complementary data line;

when a voltage level on the read bit line and a voltage level on the complementary read bit line are pre- charged to a default voltage level, controlling the read pass gate circuit to connect the data line to the read bit line and connect the complementary data line to the complementary read bit line;

receiving the data from the data line by the complementary read bit line and receiving the complementary data from the complementary data line by the complementary read bit line; and amplifying a voltage difference between the read bit line and the complementary read bit line and outputting a readout data according to the voltage level on the read bit line and the voltage level on the complementary read bit line.

20. The control method of claim 19, further comprising:

when the voltage level on the read bit line is different from the voltage level on the complementary read bit line, controlling the read pass gate circuit to disconnect the data line to the read bit line and disconnect the complementary data line to the complementary read bit line.

* * * * *